United States Patent [19]
Yoshizawa et al.

[11] Patent Number: 5,650,353
[45] Date of Patent: Jul. 22, 1997

[54] METHOD FOR PRODUCTION OF SOI SUBSTRATE

[75] Inventors: Katsuo Yoshizawa, Nagano-ken; Tsutomu Sato, Niigata-ken; Kiyoshi Mitani; Masatake Katayama, both of Gunma-ken, all of Japan

[73] Assignee: Shin-Etsu Handotai Co., Ltd., Tokyo, Japan

[21] Appl. No.: 561,166

[22] Filed: Nov. 21, 1995

Related U.S. Application Data

[63] Continuation of Ser. No. 127,731, Sep. 28, 1993, abandoned.

[30] Foreign Application Priority Data

Sep. 29, 1992 [JP] Japan .................................. 4-284009

[51] Int. Cl.⁶ .................................... H01L 21/304
[52] U.S. Cl. ........................ 437/62; 437/249; 437/974; 148/DIG. 12; 148/DIG. 135
[58] Field of Search .................... 437/21, 62, 86, 437/974, 249; 148/DIG. 12, DIG. 135

[56] References Cited

U.S. PATENT DOCUMENTS

| | | | |
|---|---|---|---|
| 4,357,180 | 11/1982 | Molner | 148/1.5 |
| 5,006,487 | 4/1991 | Stokes | 437/228 |
| 5,034,343 | 7/1991 | Rouse et al. | 437/86 |
| 5,141,887 | 8/1992 | Liaw et al. | 437/62 |
| 5,290,715 | 3/1994 | Pandya | 437/29 |
| 5,294,559 | 3/1994 | Malhi | 437/40 |

FOREIGN PATENT DOCUMENTS

| | | | |
|---|---|---|---|
| 0348783A3 | 1/1990 | European Pat. Off. | H01L 21/302 |
| 0460437A2 | 12/1991 | European Pat. Off. | H01L 21/304 |
| 0464837A3 | 1/1992 | European Pat. Off. | H01L 21/76 |

OTHER PUBLICATIONS

Patent Abstracts of Japan: V13, N413 (E–820) 12 Sep. 89; Manufacture of Semiconductor Device Substrate.
Patent Abstracts of Japan: V14, N411 (E–973) 5 Sep. 90; Manufacture of Wafer.
Patent Abstracts of Japan: V15, N212 (M–1118) 30 May 91; Cutting Method for Slicing Machine and Its Device.
S. Wolf "Silicon Processing in the VLSI Era, vol. II", Lattice Press, 1991, pp. 70–71.
Haisma et al., Jap. J. Appl. Phys. 28(8) pp. 1426–1443 (1989).

*Primary Examiner*—John Niebling
*Assistant Examiner*—Thomas G. Bilodeau
*Attorney, Agent, or Firm*—Ronald R. Snider

[57] ABSTRACT

SOI (silicon-on-insulator) substrates are efficiently produced by a method which comprises superposing and bonding at least three single crystal silicon wafers through the medium of a $SiO_2$ film formed on the surface of each of the wafers and cutting the bonded wafers along planes perpendicular to the direction of superposition thereof. The cutting can be infallibly attained with high dimensional accuracy without entailing such adverse phenomena as the vibration of the blade of a cutting tool by providing at the portions destined to be cut the grooves for guiding the blade of the cutting tool in advance of the cutting work.

2 Claims, 6 Drawing Sheets

METHOD FOR PRODUCTION OF SOI SUBSTRATE

This application is a continuation of application Ser. No. 08/127,731, filed Sep. 28, 1993, now abandoned.

BACKGROUND OF THE INVENTION

1. Field of the Invention

This invention relates to a method for the production of a silicon-on-insulator (SOI) substrate which is so configured as to have a single crystal silicon layer superposed in the form of a semiconductor single crystal layer on an insulator substrate.

2. Description of the Prior Art

The semiconductor element manufactured with a SOI substrate permits a decrease in the parasitic capacitance of wiring and, therefore, readily allows an increase in the speed of operation and further enjoys easy isolation of elements and precludes the phenomenon of latch-up which would occur in the case of a CMOS. By this reason, the SOI substrates have been recently attracting attention as wafers fit for the manufacture of three-dimensional devices which are capable of diversifying functions, augmenting the operational speed, and exalting the integration.

Heretofore, for the production of the SOI construction by the bonding of wafers, there has been employed the method which comprises directly applying a single crystal silicon wafer 101 having a $SiO_2$ film 101a formed on one surface thereof (hereinafter referred to as "wafer") as illustrated in FIG. 10 fast to a wafer 102 having no $SiO_2$ film formed thereon, to make adhered, subsequently heat-treating the adhered wafers, thereby bonding them, and then grinding and polishing the wafer 101 of the bonded wafers thereby converting the wafer 101 into a thin film and consequently giving rise to a SOI substrate 103 as illustrated in FIG. 11.

The method described above is at a disadvantage in entailing difficulty in producing inexpensively the SOI substrate because it requires either of the bonded wafers to be ground and polished until it is decreased to a residual layer thickness in the range of 1 to some tens of μm and consequently suffers from waste of not less than about 90% of the wafer.

SUMMARY OF THE INVENTION

This invention aims to solve the problem mentioned above and, for the sake of this solution, provides a method of manufacture which allows the SOI substrate to be produced at a low cost with a simple process and particularly fits mass-production of SOI substrates.

The first aspect of this invention resides in a method for production of a substrate having a semiconductor single crystal layer formed on an insulator substrate, which is characterized by superposing and bonding at least three single crystal silicon wafers through the medium of a $SiO_2$ film formed on the surface of each of the 2 wafers and cutting the superposed and bonded wafers along planes perpendicular to the direction of superposition thereof.

The second aspect of this invention resides in a method for production of a SOI substrate, which is characterized by preparing at least three single crystal silicon wafers having surfaces for bonding mirror polished, subjecting at least either of the opposite wafer main faces for bonding to a preparatory thermal oxidizing treatment thereby forming a $SiO_2$ film thereon, directly piling the surfaces of the plurality of wafers one upon another thereby combining the wafers in a tightly superposed state, heat-treating the wafers in the combined state in an atmosphere of inert gas or in an oxidizing atmosphere thereby binding the tightly adhering surfaces thereof, cutting the bonded wafers except for the wafer on one terminal side relative to the direction of superposition along planes perpendicular to the direction of superposition, and polishing the freshly cut surfaces of the resultant divided substrates by the etching technique, the planar grinding technique, the mirror polishing technique, or a similar thereby converting the divided substrates each into a thin film.

The third aspect of this invention resides in a method for production of a SOI substrate, which is characterized by preparing one single crystal silicon wafer having the opposite surfaces thereof mirror polished and then thermally oxidizing and thereby causing to form a $SiO_2$ film thereon, preparing two single crystal silicon wafers having one of the opposite surfaces thereof mirror polished, nipping the one single crystal silicon wafer with the two single crystal silicon wafers thereby forming a tightly superposed pile of wafers, heat-treating the superposed pile of wafers in an atmosphere of inert gas or in an oxidizing atmosphere thereby binding the superposed wafers, subsequently cutting the intervening single crystal silicon wafer in the bonded wafers along planes perpendicular to the direction of superposition, and subjecting the freshly cut surfaces of the divided substrates first to the planar grinding and then to the mirror polishing thereby converting the divided substrates each into a thin film.

The fourth aspect of this invention resides in a method according to any of the above-mentioned aspects of this invention, wherein guide grooves on a cylindrical side of a bonded wafers (or a bonded pile of wafers) for guiding the blade of a cutting tool are formed at the positions at which cuts are to be made in planes perpendicular to the direction of superposition in preparation for said cutting.

BRIEF DESCRIPTION OF THE DRAWINGS

The invention will be better understood and the objects and features thereof other than those set forth above will become apparent when consideration is given to the following detailed description thereof, which makes reference to the accompanying drawings wherein.

DETAILED DESCRIPTION OF PREFERRED EMBODIMENTS

Figure 1:
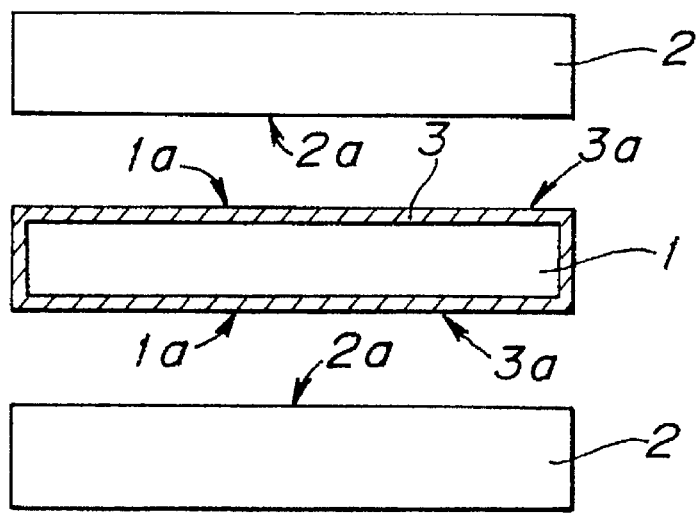
FIG. 1 is a cross section depicting Example 1 of this invention, illustrating a bond wafer and a base wafer before their mutual bonding.

When a SOI substrate is manufactured by combining five (n) wafers in accordance with the invention, for example, four wafers of the same thickness having a $SiO_2$ film formed on one of the opposite surfaces thereof and one wafer of a larger thickness (having no $SiO_2$ film formed thereon) are bonded as illustrated in an example to be cited hereafter (FIG. 9) and the three intervening wafers are cut in the prescribed portions to obtain four (n-1) SOI substrates of the same specification simultaneously.

For this invention, it is extremely important to fix the thickness of each of the wafers before they are superposed and bonded. As respects the individual SOI substrates obtained by the cutting mentioned above, the freshly cut surfaces thereof are ground and then mirror polished, for example. The loss of material of the wafers can be conspicuously decreased by setting the amounts of initial stock involved during the aforementioned cutting and those of stock during the grinding and the mirror polishing at the minimum technically attainable levels.

In the method of the second aspect of this invention, the bond of one wafer to another wafer is produced between the $SiO_2$ film surface of the former wafer and the surface (of Si) of the latter wafer. Though the mechanism of this bonding has not been exactly elucidated, it may be logically explained by a postulate that the hydrophilic OH⁻ groups present on the wafer surfaces give rise to a hydrogen bond between silicon atoms on the two wafers, one silicon atom each on the wafers, and induce tight mutual bonding of these two wafers and the heat treatment subsequently accelerates a dehydration-condensation reaction on the hydroxyl radicals and brings about more perfect bonding of the wafers.

The method of the third aspect of this invention permits production of two SOI substrates from three wafers as the minimum allowable unit of fabrication. By restraining the amounts of initial stock during the cutting and the amounts of stock during the planar grinding and the mirror polishing so as to decrease the loss of wafers, the ratio of effective utility of raw material wafers can be improved to a great extent.

From the two component single crystal silicon wafers before the superposing and bonding, the single crystal silicon wafer on which the $SiO_2$ film is formed by the thermal oxidation treatment, is selected and utilized for single crystal silicon layer for the formation of a semiconductor element of the SOI substrate. This particular selection is accounted for by the following two reasons.

The first reason is that the preparatory thermal oxidizing treatment given to the single crystal silicon layer which is destined to be utilized for the formation of a semiconductor element is effective in preventing this single crystal silicon layer from another pollution at least in the various subsequent steps in which the step of heat treatment for the bonding of superposed wafer layers is important. The second reason is that the control on physicochemical properties of the interface between the single crystal silicon layer and the $SiO_2$ film to be utilized as a layer for the formation of a semiconductor element can be carried out infallibly when this single crystal silicon layer for the formation of the semiconductor element atomically contacts the $SiO_2$ film produced by the thermal oxidizing treatment mentioned above, whereas the possibility of pollution of the layer for the formation of the semiconductor element dealt with in the first reason above cannot be precluded and the control of the physicochemical qualities of the portion of bonding and the uniformity of that quality is attained only with difficulty when the layer utilized for the formation of the semiconductor element directly contacts the $SiO_2$ film produced on the opposing bonding surface mentioned above.

Now, the present invention will be described more specifically below with reference to the working examples illustrated in the drawings.

EXAMPLE 1

First three single crystal wafers which are identical in specification inclusive of a dimensional description are prepared. As illustrated in FIG. 1, one of the single crystal wafers has both the opposite surfaces thereof and the remaining two single crystal wafers have either of the opposite surfaces thereof mirror polished. These mirror polished surfaces are designated as bond surfaces 1a and 2a. These bond surfaces are desired to have a roughness, Ra, of not more than 0.4 nm. If this surface roughness exceeds 0.4 nm, the bonding of the single crystal wafers cannot be obtained and, even when the bonding is obtained somehow or other, unbonded regions called "voids" occur in the interface of bonding and the produced SOI layer (layer for the formation of a semiconductor element) fails to constitute a uniform film.

The mirror polishing in this case is carried out by the well-known mechanochemical polishing technique.

The wafers which have been given the mirror polishing are washed with a detergent selected from among $NH_4OH/H_2O_2$, $H_2SO_4/H_2O_2$, $HCl/H_2O_2$, HF, and organic solvents for the purpose of removing therefrom the adhesive agent used for applying the wafers to a carrier plate at the time of polishing, the abrasive used for the polishing, and particles arising from the polishing, for example.

The wafer which has had both the opposite surfaces thereof mirror polished and then has been washed is to be used as a bond wafer 1 and the two wafers which have had one of the opposite surfaces thereof mirror polished and then have been washed are to be used as base wafers 2 destined to fulfill the part of a base member.

There are times when such impurities as C, H, F, and Cl which originate in the detergent mentioned above are adhering to the bond surfaces 1a and 2a of the bond wafer 1 and the base wafers 2 after the washing. In these impurities, organic impurities including carbon can be decomposed and removed by the ozone which occurs when the bond surfaces are exposed (not shown) to an ultraviolet light in an atmosphere of oxygen.

Then, the bond wafer 1 is subjected to a thermal oxidizing treatment in an oxidizing atmosphere to form a $SiO_2$ film 3 on the whole surface of the bond wafer 1 as illustrated in FIG. 1. The temperature of the thermal oxidizing treatment is desired to be in the range of 800° C. to 1,200° C. and the thickness of this film is desired to be in the approximate range of 0.1 μm to 3 μm.

Figure 2:
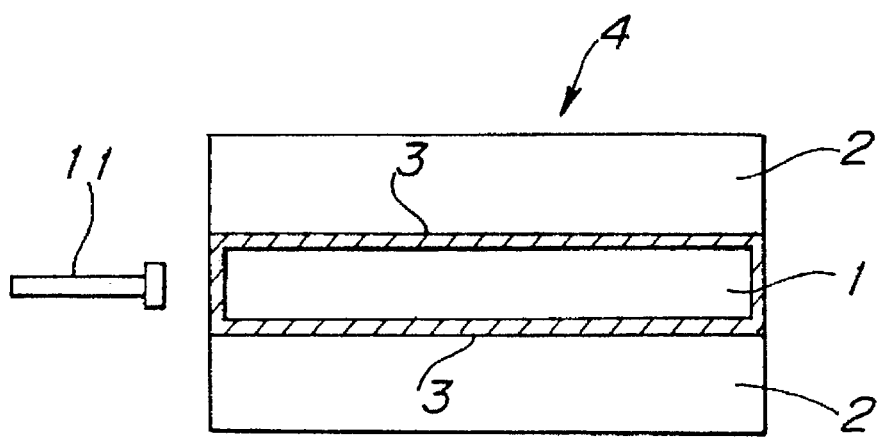
FIG. 2 is a cross section depicting Example 1, illustrating the bond wafer and the base wafer after their mutual bonding.

Now, the bond surfaces 2a, 2a of the base wafers 2 are superposed on and attached tightly to bond surfaces 3a, 3a of the $SiO_2$ film 3 which have been formed on the opposite main surfaces of the bond wafer 1. The superposed wafers are then heat-treated in an atmosphere containing $N_2$ or $O_2$ to obtain a bonded wafer 4 as illustrated in FIG. 2. The temperature of this heat treatment is required to exceed 800° C. and the duration of the heat treatment to fall in the approximate range of one to two hours.

The bonding of the wafers 1 and 2 in this case must be carried out as soon as possible after the formation of the SiO₂ film 3. If this requirement is not fulfilled, the possibility may arise that the minute dust particles floating in the ambient air will adhere fast to the bond surfaces to the extent of impairing the cleanliness thereof, giving rise to voids in the interface of bonding, unduly degrading the strength of bonding, and even preventing the production of a SOI layer of uniform quality.

The bonded wafer 4 is then cooled and subsequently cut with a diamond blade 11 in the direction along a plane perpendicular to the direction of thickness of the bond wafer 1, namely in the direction parallel to the bond surface as illustrated in FIG. 2.

Figure 3:
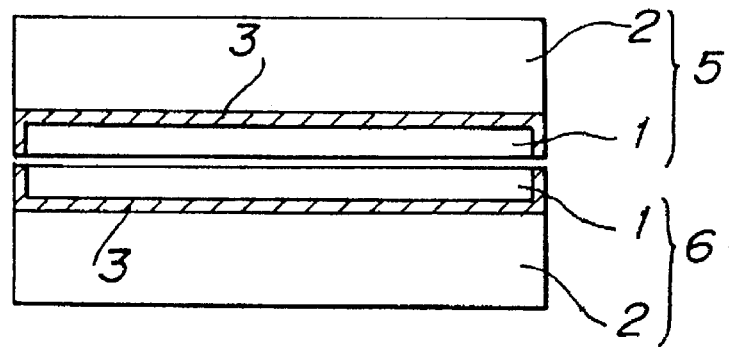
FIG. 3 is a cross section depicting Example 1, illustrating a bonded wafer after they have been cut apart.

The cutting produces two SOI substrates 5 and 6 which have a bond wafer 1' deposited thereon are formed severally on the base wafers 2 as illustrated in FIG. 3.

Figure 4:
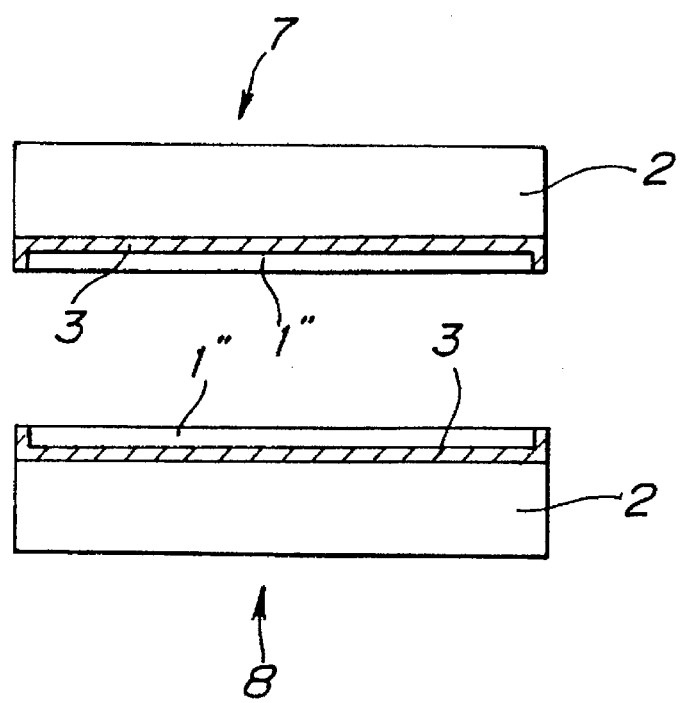
FIG. 4 is a cross section depicting Example 1, illustrating SOI substrates obtained by polishing the divided wafers.

The surfaces (the SiO₂ film 3 side surface) of the bond wafers 1' deposited one each on the two SOI substrates 5 and 6 are ground and polished until the residual wall thickness of the bond wafer 1' reaches 6 µm, for example. They are further subjected to finish polishing to reduce the bond wafers 1' to a thin film 3 µm in thickness, for example. As a result, two SOI substrates 7 and 8 are obtained as finished products which are provided on the surface thereof with an element-forming layer 1" as illustrated in FIG. 4.

Now, the method for cutting the bonded wafer 4 (FIG. 2) and the results of a relevant test will be described below.

Wafers having different diameters of 4, 5, 6, and 8 inches and an equal wall thickness of about 1,000 µm were prepared as bond wafers 1 and base wafers 2 and a plurality of bonded wafers 4 of such a construction as illustrated in FIG. 2 were manufactured with the wafers. The bonded wafers 4 were cut with a diamond blade having a varying blade thickness indicated in Table 1 given below. The amounts of stock removed from the bond wafers by cutting, grinding and polishing were as shown in the column titled "Total" in Table 1. The bond wafers used in the present experiment had a wall thickness of about 1,000 µm. The fact that such an element-forming layer 1" as illustrated in FIG. 4 has a wall thickness of not more than 10 µm justifies a conclusion that the bond wafer before cutting is required only to have a thickness which is not more than the total indicated in Table 1 plus 20 µm.

TABLE 1

| Conditions of cutting | Diameter (inch) of silicon wafer | 4 | 5 | 6 | 8 |
|---|---|---|---|---|---|
| | Feed speed for cutting (mm/min.) | 65 | 60 | 50 | 40 |
| | Thickness of blade (µm) | 300 | 300 | 300 | 300 |
| Amount of stock removed by cutting, polishing, etc. | Amount of stock removed during cutting (A): (µm) | ca. 320 | ca. 320 | ca. 320 | ca. 400 |
| | Thickness of layer strained by fabrication during cutting (µm) | ca. 15 | ca. 19 | Ca. 20 | ca. 22 |
| | Amount of stock removed by grinding and polishing after cutting (B): (µm) | 30~50 | 30~50 | 30~60 | 30~60 |
| | Total, A + 2B (µm) | ca. 380~420 | ca. 380~420 | ca. 380~440 | ca. 460~520 |

Here, the procedure for cutting a wafer with the diamond blade mentioned above will be described below. A cutter device (not shown) comprises a retaining disc having one terminal surface thereof adapted as a wafer-fixing surface, a plurality of suction discs capable of vacuum aspiration, and the diamond blade attached to the shaft of a drive motor. In this case, the wafer-fixing surface of the retaining disc is opposed to the suction discs, and the retaining disc is adapted to be moved with fine adjustment in the direction vertical to the wafer-fixing surface and in the direction toward the suction discs by means of an index pitch mechanism provided in the retaining disc. The suction discs are adapted to be moved toward and away from the wafer surface by means of a drive arm, and the blade is adapted to have the blade surface reciprocated in the direction parallel to the wafer-fixing surface. The cutting of the bonded wafer 4 is prepared by fixing this bond wafer on the wafer-fixing surface, and fixing the outer opposite surfaces at one end of the bonded wafer 4 (the two surfaces farthest from the diamond blade) with holding plates (not shown) made of epoxy resin, a material having no possibility of scratching a wafer, and endowed with a clamping function. Then, the cutting is initiated after causing the retaining disc to be moved as finely adjusted thereby enabling the edge of the diamond blade to be opposed exactly to the outer surface of the bond wafer 1, further advancing the suction disc with the drive arm so as to exert a suction force in the direction of peeling the bonded wafer 4 from the retaining disc on the bonded wafer 4, then advancing the blade parallelly to the bond wafer 1, and pressing the blade against the outer surface of the wafer. In this case, the aforementioned holding plates are simultaneously cut with the wafer. Since one surface of the bonded wafer 4 is under the influence of the suction force of the suction disc and the other surface is fixed to the retaining disc, the cutting proceeds while, of the divided bond wafers being formed by the cutting, that on the suction disc side is separated from that on the retaining disc side. After the cutting is completed, the two divided bonded wafers are perfectly separated from each other by the action of the drive arm. In the operation described above, it is important that the vibration of the motor shaft and other similar adverse phenomena should be restrained to the fullest possible extent.

Figure 5:
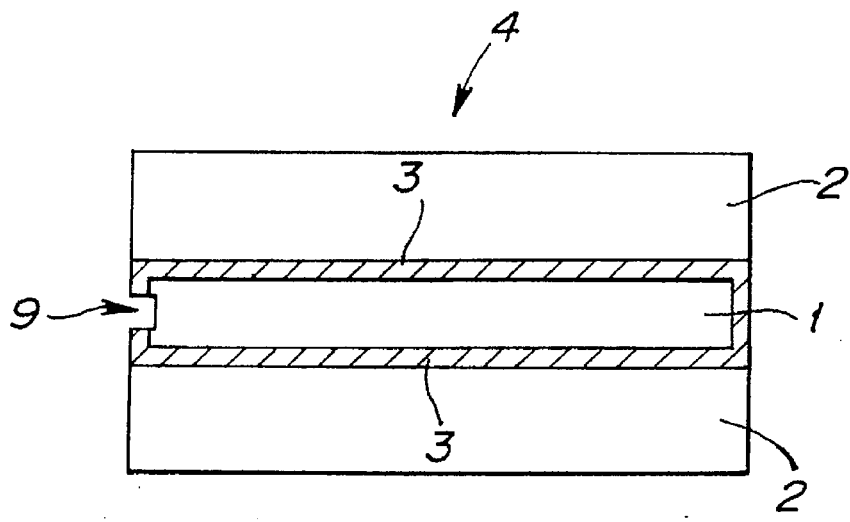
FIG. 5 is a cross section illustrating a bonded wafer having formed on the cylindrical side of a bonded wafers a groove for guiding the blade of a cutting tool.

When a guide groove 9 for guiding the edge of the diamond blade is provided at the position of cutting of the bond wafer 1 as illustrated in FIG. 5 in preparation for the cutting of the bond wafer 1 along a plane perpendicular to the direction of thickness of the bond wafer 1, the cutting can be infallibly attained with highly satisfactory dimensional accuracy because the edge of the diamond blade is not suffered to vibrate.

The thickness of the edge of the diamond blade is governed by the diameter of the bond wafer to be cut, the feed rate of cutting, and a similar. This thickness must be decreased in proportion as the diameter of the bond wafer decreases and it must be increased in proportion as the diameter increases. Depending on the size of this diameter, the thickness is selected in the range of 250 µm to 400 µm with due respect to the feed rate of cutting and the balance between the strength of the blade and the accuracy of cutting. Thus, the initial stock for cutting which embraces the influence of the change of blade thickness by the lateral vibration of the blade in the process of cutting is the sum of the thickness of blade plus 20 µm, i.e. a value in the range of 270 µm to 420 µm.

The SOI substrate is basically composed of a supporting layer indicated as a base wafer 2, an insulating layer (SiO₂ film 3) made of SiO₂, and an element-forming layer 1" constituting itself the uppermost layer. The amount of stock to be removed by the etching to be performed during the formation of the element-forming layer 1" and the grinding, polishing, etc. is roughly 30 μm to 60 μm. The reason for this particular amount of stock is that even when the cutting with the diamond blade formsin the opposed wall surfaces of a cut in the wafer a layer of strain by fabrication about 15 to 22 μm in thickness, this layer of strain by fabrication can be completely removed by selecting the amount of stock for the cutting in the range between 30 μm and 60 μm.

The thickness of the bond wafer 1 destined to be cut must be set with due respect to the amount of stock removed during the process of cutting, the thickness of the layer of strain by fabrication desired to be removed, the amounts of stock removed by etching, grinding, and polishing, and the thickness of the element-forming layer in the finally produced SOI substrate.

Desirably in the SOI substrate, the thickness of the element-forming layer is in the range of 0.01 μm to 100 μm, that of the $SiO_2$ insulating layer in the range of 0.1 μm to 3.0 μm, and that of the base wafer 2 in the range of 300 μm to 1,000 μm.

As respects the element-forming layer, a thickness of not more than 100 μm suffices for the formation of an element. If this thickness exceeds the upper limit mentioned above, the excess merely adds to the cost of this layer. Conversely, if the thickness is less than 0.01 μm, the fabrication is not easily attained even with a highly advanced technique.

The thickness of the $SiO_2$ insulating layer is only required to exceed 0.1 μm for ensuring ample manifestation of the dielectric strength aimed at. If this thickness exceeds 3.0 μm, the excess brings about no advantage.

The thickness of the supporting layer has a range of itself for retaining proper mechanical strength, depending on the diameter of wafer. In consideration of wafers which measure 3 to 8 inches in diameter, the thickness of substrate is proper in the range of 300 μm to 1,000 μm.

EXAMPLE 2

Figure 6:
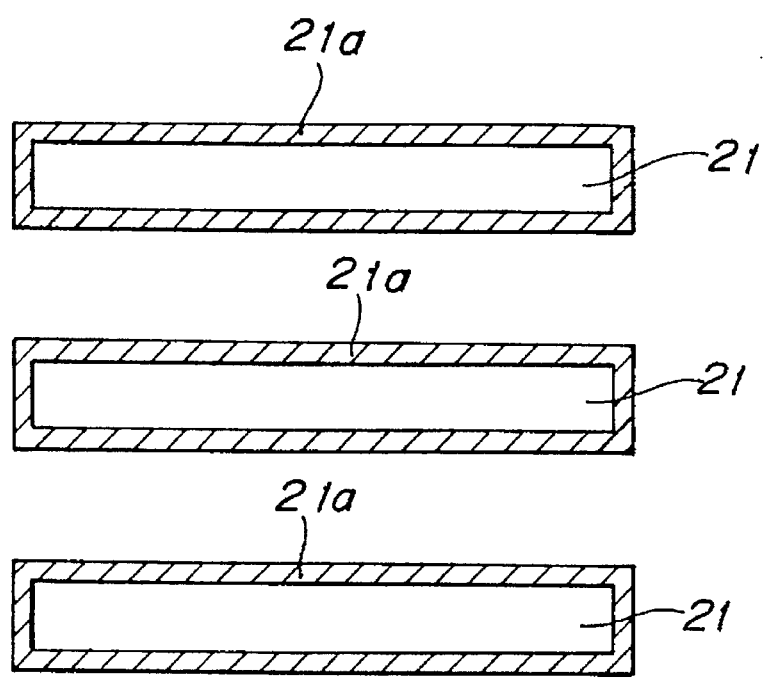
FIG. 6 is an explanatory cross section depicting Example 2 of this invention.

FIG. 6 depicts an example in which two bonded wafers are obtained from three single crystal silicon wafers 21 having an equal specification and having a $SiO_2$ film 21a formed on the whole surface thereof. In this case, two SOI substrates which are identical in specification are manufactured by bonding the three silicon wafers and then subjecting the intermediate one of the three superposed silicon wafers 21 to the cutting and to the subsequent mirror polishing in faithful accordance with the procedure of Example 1.

EXAMPLE 3

Figure 7:
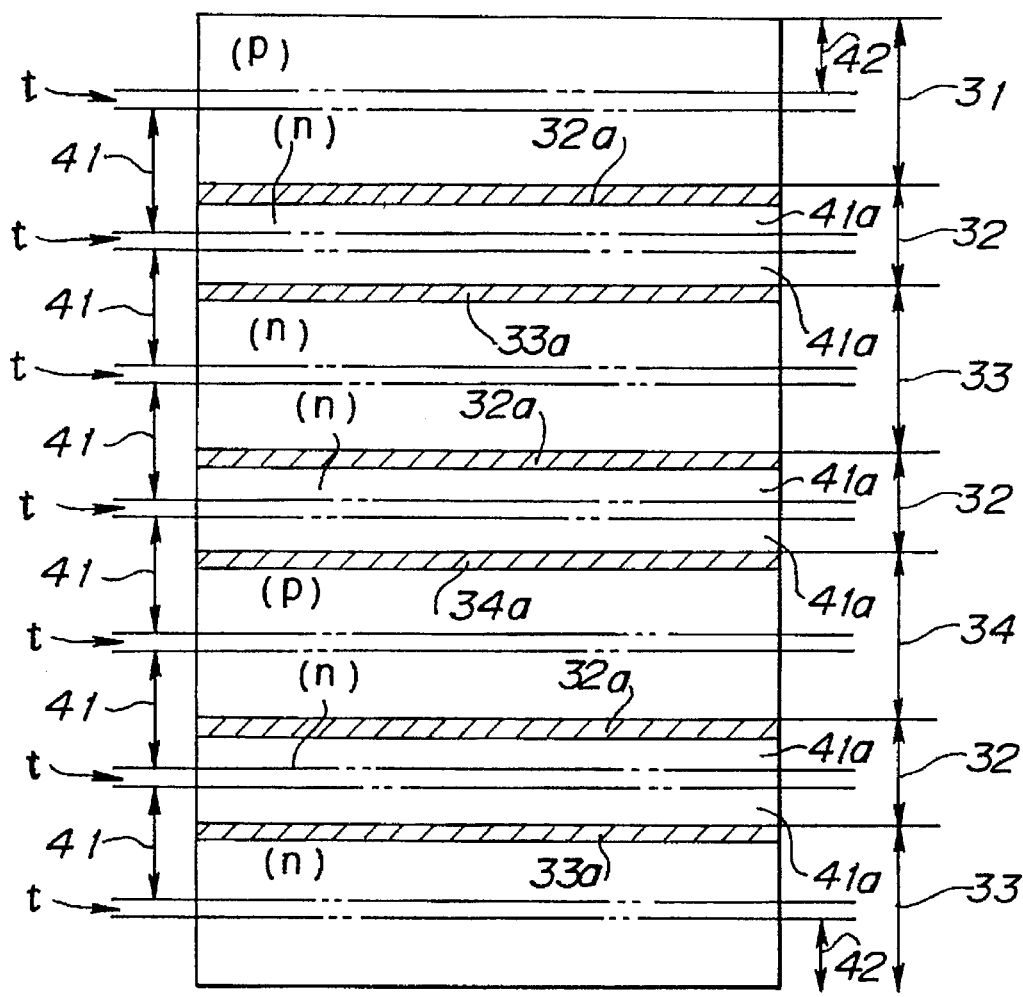
FIG. 7 is an explanatory cross section depicting Example 3 of this invention.

FIG. 7 depicts an example in which single crystal silicon wafers differing in form of electroconductivity and thickness are superposed and bonded.

A total of seven silicon wafers, i.e. one p-type silicon wafer 31, three n-type silicon wafers 32 having a $SiO_2$ film 32a formed on one of the opposite surfaces thereof, two n-type silicon wafers 33 having a $SiO_2$ film 33a formed on one of the opposite surfaces thereof and having a thickness equal to that of the wafer 31 and roughly twice as large as that of the wafers 32, and one p-type silicon wafer 34 having a $SiO_2$ film formed on one of the opposite surfaces thereof and having a thickness equal to that of the silicon wafer 31, are prepared. They are superposed and bonded as illustrated in FIG. 7. In all the silicon wafers, the portions of a thickness t indicated by two-dot chain lines are subjected to cutting and then six bonded wafers are subjected to mirror polishing. Thus, six SOI substrates 41 (unpolished SOI substrates to be exact) having an equal overall thickness and different electrical properties are simultaneously manufactured. With reference to FIG. 7, p and n stand for types of electroconductivity, 41a stands for an element-forming layer, and 42 stands for a portion to be discarded by cutting. In this case, the thickness of the portions 42 to be discarded can be minimized by thinning the wafers 31 and 33 forming respectively the uppermost and lowermost layers of the bonded wafer to the fullest possible extent.

For the operation of cutting mentioned above, the same cutter device as used in cutting the bonded wafer 4 mentioned above can be used.

In this case, the portions indicated by the two-dot chain lines in FIG. 7 can be wholly cut conveniently by cutting into the wafer nearest to the suction disc in a prescribed thickness, separating the cut portions from the wafers on the retaining disc side, moving the retaining disc by a prescribed distance toward the suction disc side by the index pitch mechanism, performing the cutting operation, and then repeating this procedure.

EXAMPLE 4

Figure 8:
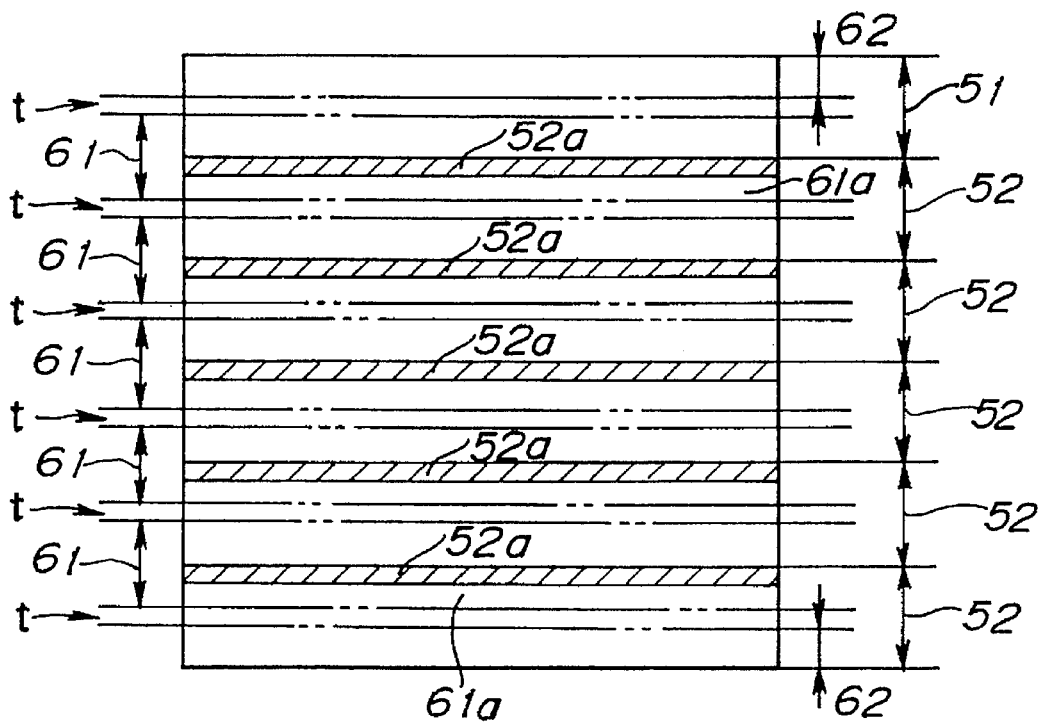
FIG. 8 is an explanatory cross section depicting Example 4 of this invention.

FIG. 8 depicts a case of simultaneous manufacture of five SOI substrates 61 identical in specification by preparing six silicon wafers 51 identical in specification inclusive of type of electroconductivity and resistivity, treating five of the six silicon wafers 51 thereby forming a $SiO_2$ film 51a on one of the opposite surfaces thereof and producing five silicon wafers 52 each provided with the $SiO_2$ film, superposing and bonding the six silicon wafers as illustrated in FIG. 8, and inserting cuts in the resultant bond wafer in the same manner as in Example 3. In the diagram of FIG. 8, 61a stands for an element-forming layer and 62 for a portion to be discarded by the cutting.

EXAMPLE 5

Figure 9:
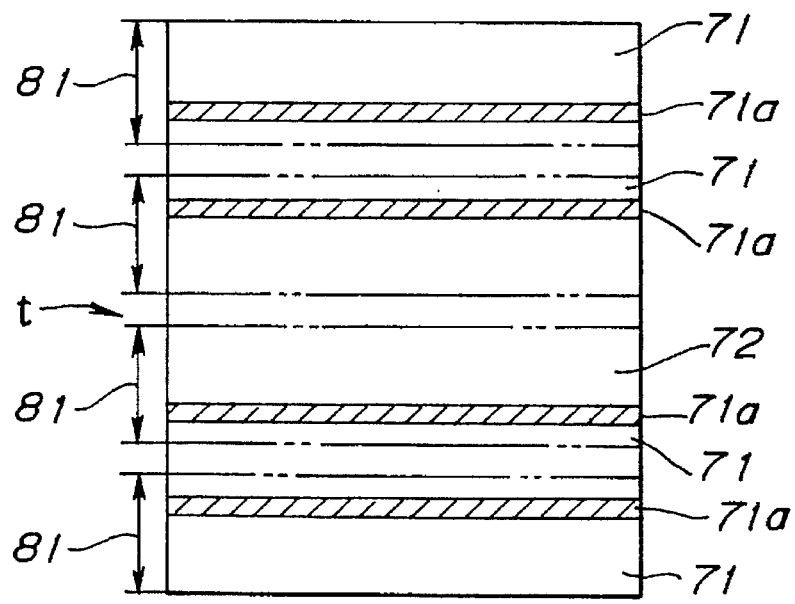
FIG. 9 is an explanatory cross section depicting Example 5 of this invention.
Figure 10:
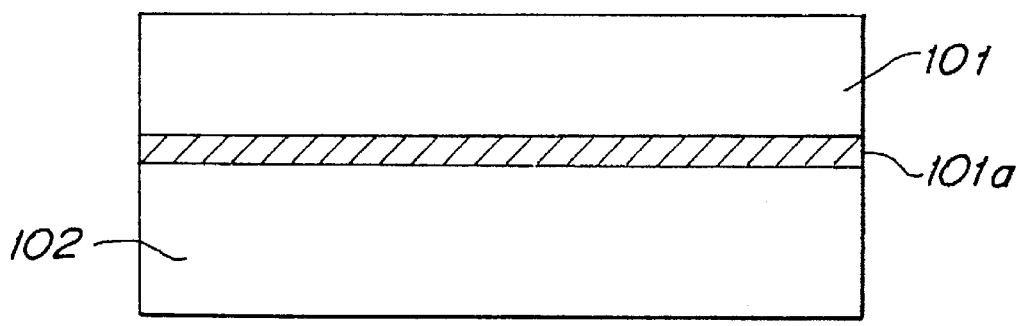
FIG. 10 is a cross section depicting the conventional example, illustrating the construction of a bonded wafer.
Figure 11:
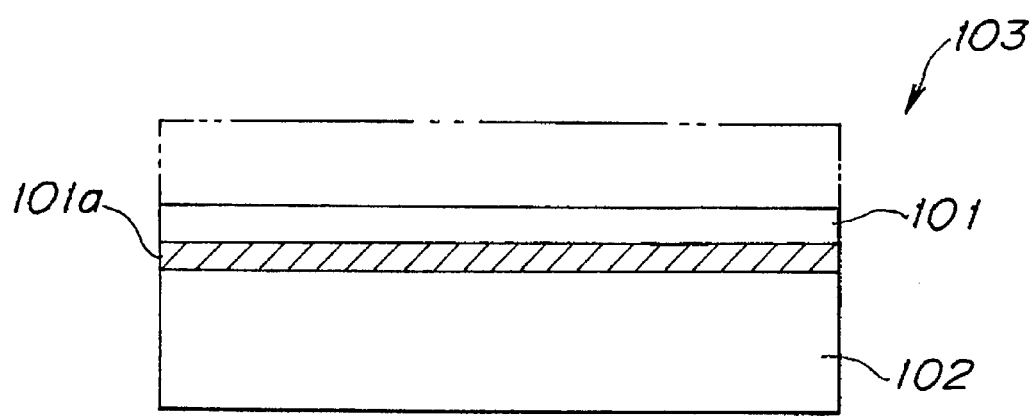
FIG. 11 is a cross section depicting the conventional example, illustrating a SOI substrate.

FIG. 9 depicts a case of simultaneous manufacture of four SOI substrates 81 identical in specification by preparing four silicon wafers 71 having a $SiO_2$ film 71a formed on one of the opposite surfaces thereof and one silicon wafer 72 having a thickness twice as large as that of the silicon wafer 71, bonding the silicon wafers, and cutting the bonded silicon wafers in the same manner as described above.

In this case, the loss of wafer can be reduced substantially to nil by suitably setting the thickness of the silicon wafer 72.

It is clearly noted from the description given above that the method of manufacture of a SOI substrate by the first aspect of this invention permits fabricated substrates to be produced with a high operational efficiency without entailing any waste of raw material wafer.

Especially by the particular embodiment of the second aspect of this invention, n-1 SOI substrates can be obtained from n wafers.

In this case, n-1 SOI substrates can be conveniently manufactured by causing a bulk of bonded wafers obtained by superposing and bonding n wafers to be cut with the aforementioned cutter device which is provided with a retaining disc, suction discs, and an index pitch mechanism. Thus, the method under discussion excels in the ability to mass-produce SOI substrates.

Then, the loss of raw material can be minimized by setting the thickness of each raw material wafer at the irreducible minimum of demand.

The methods of the second and the third aspect of this invention enable a plurality of wafers to be bonded by a simple process of heat-treating the wafers in the superposed state without calling for use of any adhesive agent.

The method of the third aspect of this invention obtains SOI substrates by preparing at least two ordinary mirror polished wafers and a wafer having a SiO₂ film formed on both surfaces thereof, directly superposing the former wafers one each on the opposite surfaces of the latter wafer, and bonding opposed Si surfaces and SiO₂ film surfaces thereby forming a three-layer bonded wafer, and thereafter cutting the bonded wafer in the portion of the latter wafer. Thus, the process of manufacture and the apparatus of manufacture involved in this case are both convenient. Particcularly, the loss of raw material can be decreased conspicuously because this method permits production of two SOI substrates from three raw material wafers.

Comparison of this method with the conventional method described above reveals that, on calculation, the present method obtains five SOI substrates and the conventional method three SOI substrates respectively from six wafers. This method, therefore, allows the cost of material to be decreased to ⅗ of that which is required by the conventional method and, therefore, promises a notable cut of the cost of SOI substrates.

Further, since the conversion of one surface side of the bonded wafer into a thin film is accomplished by grinding or polishing, the time spent for this conversion can be shortened and the labor required therefor can be notably decreased.

In accordance with the method of the fourth asect of this invention, since the portion destined to be cut is provided with a groove for guiding the blade of the cutting tool in advance of the cutting work, the cutting can be infallibly attained with high dimensional accuracy without entailing such adverse phenomina as the vibration of the blade.

While there have been shown and described preferred embodiments of this invention, it is to be distinctly understood that the present invention is not limited thereto but may be otherwise variously embodied and practiced within the scope of the claims given below.

What is claimed is:

1. A method for the production of a substrate having semiconductor single crystal layers formed on an insulating substrate, comprising the steps of:

preparing at least three single crystal silicon wafers having surfaces for bonding mirror polished;

subjecting either one of the opposite wafer surfaces for bonding to a preparatory thermal oxidizing treatment thereby forming a SiO₂ film thereon;

directly piling the surfaces of said wafers one upon another thereby combining said wafers in a superposed state;

heat-treating said wafers in said superposed state in an atmosphere of inert gas or in an oxidizing atmosphere thereby binding the adhering surfaces thereof;

cutting the bonded wafers except for the wafer on one terminal side relative to the direction of superposition along planes perpendicular to said direction of superposition;

polishing the cut surfaces of the resultant divided substrates thereby converting said divided substrates each into a thin film; and wherein guide grooves for guiding the blade of a cutting tool in advance of cutting work are formed at the positions at which cuts are to be made in planes perpendicular to the direction of superposition in preparation for said cutting.

2. A method for the production of a substrate having semiconductor single crystal layers formed on an insulating substrate, comprising the steps of:

preparing one single crystal silicon wafer having both surfaces thereof mirror polished and then thermally oxidizing and thereby causing a SiO₂ film to form thereon;

preparing two single crystal silicon wafers having one of the surfaces thereof mirror polished;

superposing said one single crystal silicon wafer between said two single crystal silicon wafers thereby forming a superposed pile of wafers;

heat-treating said superposed pile of wafers in an atmosphere of inert gas or in an oxidizing atmosphere thereby binding the superposed wafers;

subsequently cutting said one single crystal silicon wafer along planes perpendicular to the direction of superposition;

subjecting the cut surfaces of the divided substrates to the planar grinding and then the mirror polishing thereby converting said divided substrates each into a thin film; and wherein guide grooves for guiding the blade of a cutting tool in advance of cutting work are formed at the positions at which cuts are to be made in planes perpendicular to the direction of superposition in preparation for said cutting.

* * * * *